(12) United States Patent
Lee et al.

(10) Patent No.: US 10,313,573 B2
(45) Date of Patent: Jun. 4, 2019

(54) PORTABLE ELECTRONIC DEVICE AND IMAGE-CAPTURING MODULE THEREOF, AND CARRIER ASSEMBLY THEREOF

(71) Applicant: AZUREWAVE TECHNOLOGIES, INC., New Taipei (TW)

(72) Inventors: Tseng-Chieh Lee, New Taipei (TW); Kung-An Lin, Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 15/673,874

(22) Filed: Aug. 10, 2017

(65) Prior Publication Data
US 2018/0332202 A1 Nov. 15, 2018

(30) Foreign Application Priority Data
May 12, 2017 (TW) .............................. 106115785 A

(51) Int. Cl.
*H04N 5/225* (2006.01)
*H05K 1/18* (2006.01)
*H04N 5/374* (2011.01)

(52) U.S. Cl.
CPC ......... *H04N 5/2257* (2013.01); *H04N 5/2253* (2013.01); *H04N 5/2254* (2013.01); *H04N 5/374* (2013.01); *H05K 1/181* (2013.01); *H05K 2201/10121* (2013.01); *H05K 2201/10151* (2013.01); *H05K 2201/10424* (2013.01)

(58) Field of Classification Search
CPC .................................................. H04N 5/2257
USPC ......................................................... 348/376
See application file for complete search history.

(56) References Cited

U.S. PATENT DOCUMENTS

2008/0105819 A1* 5/2008 Wu ................... H01L 27/14618
250/216
2009/0160998 A1* 6/2009 Fukamachi ............ G02B 7/021
348/340

FOREIGN PATENT DOCUMENTS

| JP | 2008017505 A | 1/2008 |
| JP | 2008113199 A | 5/2008 |
| JP | 2011119860 A | 6/2011 |
| KR | 1020100062380 A | 6/2010 |
| KR | 1020130031631 A | 3/2013 |
| KR | 1020170025767 A | 3/2017 |

(Continued)

*Primary Examiner* — Joel W Fosselman
(74) *Attorney, Agent, or Firm* — Li & Cai Intellectual Property (USA) Office

(57) ABSTRACT

The present invention provides a portable electronic device, and an image-capturing module thereof and a carrier assembly thereof. The image-capturing module includes a circuit substrate, an image-sensing chip, at least one electronic component, a package structure, and a lens assembly. The circuit substrate has a top surface and a bottom surface. The image-sensing chip is electrically connected to the circuit substrate, and the image-sensing chip has an image-sensing area. The at least one electronic component is disposed on the top surface of the circuit substrate and electrically connected to the circuit substrate. The package structure is disposed on the top surface of the circuit substrate to cover the at least one electronic component. The lens assembly includes a holder structure disposed on the package structure and a lens structure held by the holder structure and corresponding to the image-sensing area.

7 Claims, 9 Drawing Sheets

(56) References Cited

FOREIGN PATENT DOCUMENTS

TW        M416115 U1    11/2011

\* cited by examiner

PORTABLE ELECTRONIC DEVICE AND IMAGE-CAPTURING MODULE THEREOF, AND CARRIER ASSEMBLY THEREOF

FIELD OF THE INVENTION

The present disclosure relates to a portable electronic device, an image-capturing module thereof and a carrier assembly thereof, and more particularly to a portable electronic device, an image-capturing module thereof and a carrier assembly thereof for decreasing a width of a lens holder.

BACKGROUND OF THE INVENTION

The advantages of CMOS (Complementary Metal-Oxide-Semiconductor) are low power consumption and small size, thus allowing the CMOS sensor package module to be integrated into portable electronic devices with small size such as mobile phones and notebooks. However, a width of a lens holder of the CMOS sensor package module cannot be decreased due to electronic components that are disposed on a PCB of the CMOS sensor package module.

SUMMARY OF THE INVENTION

One aspect of the present disclosure relates to a portable electronic device, an image-capturing module thereof and a carrier assembly thereof.

One of the embodiments of the present disclosure provides an image-capturing module, including a circuit substrate, an image-sensing chip, at least one electronic component, a package structure, and a lens assembly. The circuit substrate has a top surface and a bottom surface. The image-sensing chip is electrically connected to the circuit substrate, and the image-sensing chip has an image-sensing area. The at least one electronic component is disposed on the top surface of the circuit substrate and electrically connected to the circuit substrate. The package structure is disposed on the top surface of the circuit substrate to cover the at least one electronic component. The lens assembly includes a holder structure disposed on the package structure and a lens structure being held by the holder structure and corresponding to the image-sensing area.

More particularly, the image-capturing module further includes a reinforcing structure disposed on the bottom surface of the circuit substrate to surround the image-sensing chip, and the thickness of the reinforcing structure is greater than the thickness of the image-sensing chip. The reinforcing structure includes a reinforcing board surrounding the image-sensing chip and a receiving space passing through the reinforcing structure, and the whole image-sensing chip is received inside the receiving space of the reinforcing structure.

More particularly, the image-capturing module further includes a filter element disposed on one of the circuit substrate, the image-sensing chip and the package structure, and the filter element is disposed between the image-sensing chip and the lens structure. The circuit substrate has a through opening connected between the top surface and the bottom surface of the circuit substrate, the image-sensing chip is disposed on the bottom surface of the circuit substrate, and the image-sensing area of the image-sensing chip faces the through opening of the circuit substrate.

More particularly, the package structure has a flattening surface, and the holder structure is disposed on the flattening surface of the package structure without contacting the circuit substrate. The package structure has a single package body and a light-transmitting window passing through the single package body and being communicated with the through opening, and the single package body has a surrounding light-guiding surface disposed inside the light-transmitting window.

More particularly, the package structure has a dustproof coating disposed on an outer surface thereof, and the holder structure is disposed on the dustproof coating of the package structure without contacting the circuit substrate. The package structure has a single package body and a light-transmitting window passing through the single package body and being communicated with the through opening, and the single package body has a surrounding light-guiding surface disposed inside the light-transmitting window.

Another one of the embodiments of the present disclosure provides a carrier assembly, including a circuit substrate, a package structure, and a holder structure. The circuit substrate is used for carrying at least one electronic component, and the at least one electronic component is electrically connected to the circuit substrate. The package structure is disposed on the circuit substrate to cover the at least one electronic component. The holder structure is disposed on the package structure.

More particularly, the carrier assembly further includes a reinforcing structure disposed on the circuit substrate, and the package structure and the reinforcing structure are disposed on two opposite surfaces of the circuit substrate, wherein the package structure has a dustproof coating disposed on an outer surface thereof, and the holder structure is disposed on the dustproof coating of the package structure without contacting the circuit substrate, wherein the package structure has a single package body and a light-transmitting window passing through the single package body, and the single package body has a surrounding light-guiding surface disposed inside the light-transmitting window Yet another one of the embodiments of the present disclosure provides a portable electronic device using an image-capturing module, characterized in that the image-capturing module includes a circuit substrate, an image-sensing chip, at least one electronic component, a package structure, and a lens assembly. The circuit substrate has a top surface and a bottom surface. The image-sensing chip is electrically connected to the circuit substrate, and the image-sensing chip has an image-sensing area. The at least one electronic component is disposed on the top surface of the circuit substrate and electrically connected to the circuit substrate. The package structure is disposed on the top surface of the circuit substrate to cover the at least one electronic component. The lens assembly includes a holder structure disposed on the package structure and a lens structure held by the holder structure and corresponding to the image-sensing area.

Therefore, the horizontal width or the horizontal size of the holder structure can be decreased by matching the features of "the package structure being disposed on the circuit substrate to cover the at least one electronic component" and "the holder structure being disposed on the package structure".

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of a portable electronic device and an image-capturing module thereof, and a carrier assembly thereof according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

First Embodiment

Figure 1:
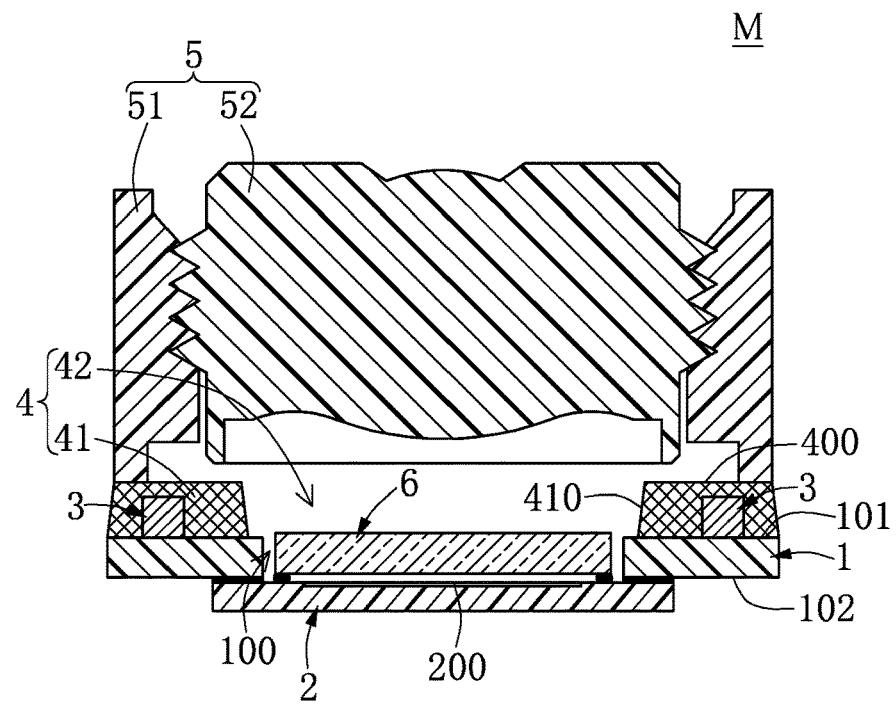
FIG. 1 shows a schematic view of an image-capturing module according to the first embodiment of the present disclosure.

Referring to FIG. 1, the first embodiment of the present disclosure provides an image-capturing module M, including a circuit substrate 1, an image-sensing chip 2, at least one electronic component 3, a package structure 4, and a lens assembly 5.

First, the circuit substrate 1 has a top surface 101 and a bottom surface 102. More particularly, the circuit substrate 1 has a through opening 100 connected between the top surface 101 and the bottom surface 102 of the circuit substrate 1. For example, the circuit substrate 1 may be a PCB rigid board (such as BT, FR4, or FR5 etc.), a rigid-flex board, or a ceramic board, etc., but it is not meant to limit the scope of the present disclosure.

Moreover, the image-sensing chip 2 is electrically connected to the circuit substrate 1, and the image-sensing chip 2 has an image-sensing area 200. More particularly, the image-sensing chip 2 is disposed on the bottom surface 102 of the circuit substrate 1, and the image-sensing area 200 of the image-sensing chip 2 can face the through opening 100 of the circuit substrate 1. For example, the image-sensing chip 2 may be a CMOS (Complementary Metal-Oxide-Semiconductor) sensor or any kind of image sensor that can be used for capturing images, but it is not meant to limit the scope of the present disclosure.

Furthermore, the at least one electronic component 3 is disposed on the top surface 101 of the circuit substrate 1 and electrically connected to the circuit substrate 1. For example, there may be two electronic components 3 shown in figures of the prevent disclosure, and the electronic component 3 may be a passive component such as a capacitor, a resistor, a drive IC, or an EEPROM, but it is merely an example and is not meant to limit the scope of the present disclosure.

In addition, the package structure 4 is disposed on the top surface 101 of the circuit substrate 1 to cover the two electronic components 3 or the at least one electronic component 3 (that is to say, one of the two electronic components 3 may be exposed out of the package structure 4). More particularly, the package structure 4 has a single package body 41 (such as a surrounding encapsulation body) and a light-transmitting window 42 (such as a through hole) passing through the single package body 41 and being communicated with the through opening 100 of the circuit substrate 1, and the single package body 41 has a surrounding light-guiding surface 410 (such as an inner surrounding surface) disposed inside the light-transmitting window 42. For example, the package structure 4 can be formed as a molding base by molding, and the package structure 4 can have a micrometer flattening surface 400 formed by fine grinding, but it is not meant to limit the scope of the present disclosure.

It should be noted that the package structure 4 is disposed on the top surface 101 of the circuit substrate 1 so as to increase the structural strength of the circuit substrate 1 due to the support of the package structure 4, so that the rigidity of the circuit substrate 1 can be increased without causing warpage.

Moreover, the lens assembly 5 includes a holder structure 51 (i.e., a lens holder) disposed on the package structure 4 and a lens structure 52 being held or supported by the holder structure 51 and corresponding to the image-sensing area 200 of the image-sensing chip 2. For example, the holder structure 51 may be a fixed seat or a voice coil motor (VCM), and the lens structure 52 may be composed of many lenses, but it is not meant to limit the scope of the present disclosure. In addition, for example, the holder structure 51 can be disposed on the flattening surface 400 of the package structure 4 through an adhesive paste (not shown) without contacting the circuit substrate 1, but it is not meant to limit the scope of the present disclosure.

It should be noted that the image-capturing module M further includes a filter element 6 disposed on one of the circuit substrate 1, the image-sensing chip 2 and the package structure 4, and the filter element 6 is disposed between the image-sensing chip 2 and the lens structure 52. For example, the filter element 6 can be disposed on the image-sensing chip 2 (as shown in FIG. 1), or the filter element 6 can be supported above the image-sensing chip 2 through spacers (not shown). In addition, the filter element 6 may be a coated glass or a non-coated glass, but it is merely an example and is not meant to limit the scope of the present disclosure.

Figure 2:
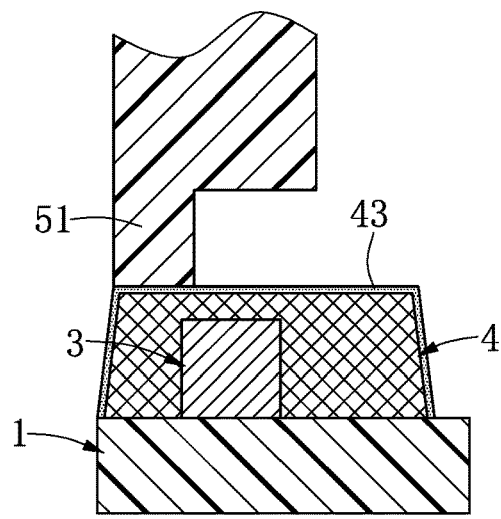
FIG. 2 shows a schematic view of a package structure having a dustproof coating disposed on an outer surface thereof according to the present disclosure.

It should be noted that the package structure 4 further has a protection layer formed on the outer surface thereof as shown in FIG. 2. For example, the package structure 4 has a dustproof coating 43 disposed on the outer surface thereof so as to prevent dust particles from being attached to the package structure 4. In addition, the holder structure 51 is disposed on the dustproof coating 43 of the package structure 4 through an adhesive paste (not shown) without contacting the circuit substrate 1, but it is merely an example and is not meant to limit the scope of the present disclosure.

In conclusion, the flattening surface 400 of the package structure 4 can be used as a carrier substrate for carrying the lens assembly 5, so that the flatness of the lens assembly 5 relative to the circuit substrate 1 can be increased, and the alignment precision between the lens assembly 5 and the image-sensing chip 2, that is to say, the tilt of the lens assembly 5 relative to the image-sensing chip 2 is decreased. In addition, the holder structure 51 can be directly disposed on the package structure 4 without moving away horizontally from the electronic component 3, so that the horizontal width (i.e., the width in a horizontal direction, such as X direction width or Y direction width) of the holder structure 51 can be decreased, or the horizontal size (i.e., the size in a horizontal direction) of the holder structure 51 can be decreased.

Second Embodiment

Figure 3:
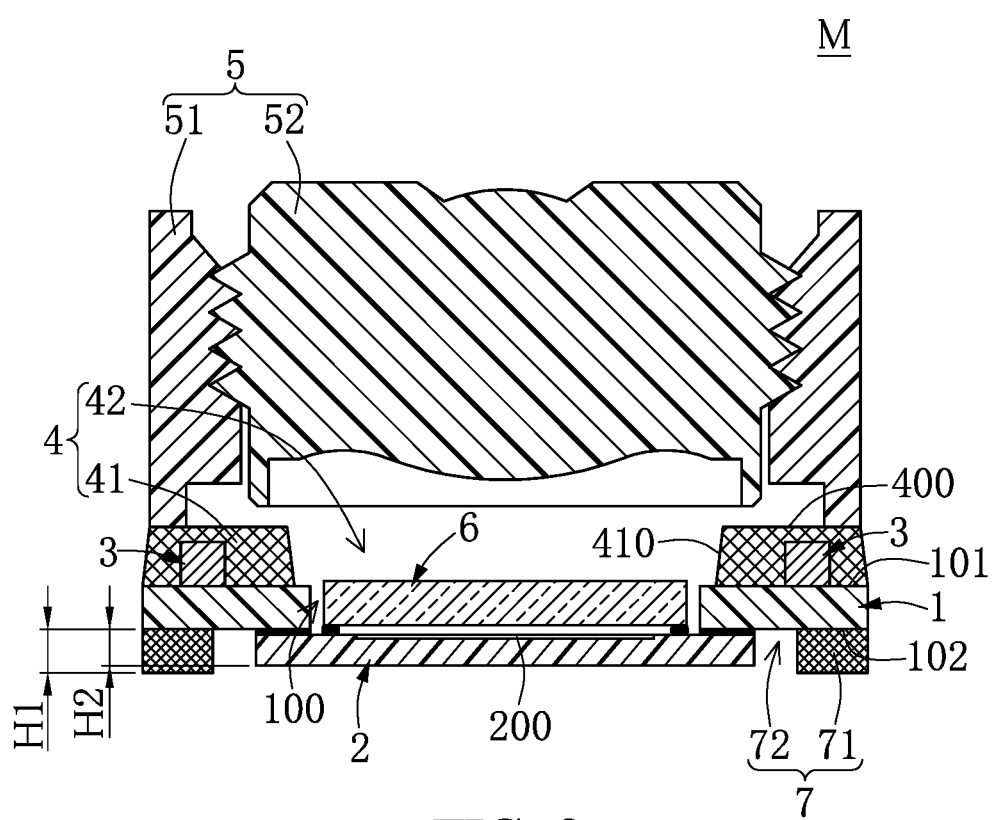
FIG. 3 shows a schematic view of the image-capturing module according to the second embodiment of the present disclosure.

Referring to FIG. 3, the second embodiment of the present disclosure provides an image-capturing module M, including a circuit substrate 1, an image-sensing chip 2, at least one electronic component 3, a package structure 4, and a lens assembly 5. Comparing FIG. 3 with FIG. 1, the difference between the second embodiment and the first embodiment is as follows: in the second embodiment, the image-capturing module M further includes a reinforcing structure 7 (or a strengthening structure) disposed on the bottom surface 102 of the circuit substrate 1 to surround the image-sensing chip 2, and the thickness H1 of the reinforcing structure 7 is greater than the thickness H2 of the image-sensing chip 2. In addition, the reinforcing structure 7 includes a reinforcing board 71 surrounding the image-sensing chip 2 and a receiving space 72 passing through the reinforcing structure 71, and the whole image-sensing chip 2 is received inside the receiving space 72 of the reinforcing structure 7 so that the image-sensing chip 2 can be protected by the reinforcing structure 7.

Therefore, the reinforcing structure 7 is disposed on the bottom surface 102 of the circuit substrate 1 so as to increase the structural strength of the circuit substrate 1 due to the support of the reinforcing structure 7, so that the rigidity of the circuit substrate 1 can be increased without causing warpage. In addition, the thickness H1 of the reinforcing structure 7 is greater than the thickness H2 of the image-sensing chip 2, so that the distance from the top side of the reinforcing structure 7 to the bottom surface 102 of the circuit substrate 1 is greater than the distance from the top side of the image-sensing chip 2 to the bottom surface 102 of the circuit substrate 1. Hence, the reinforcing structure 7 can be used to protect the image-sensing chip 2 and prevent the image-sensing chip 2 from collision with foreign objects.

Third Embodiment

Figure 4:
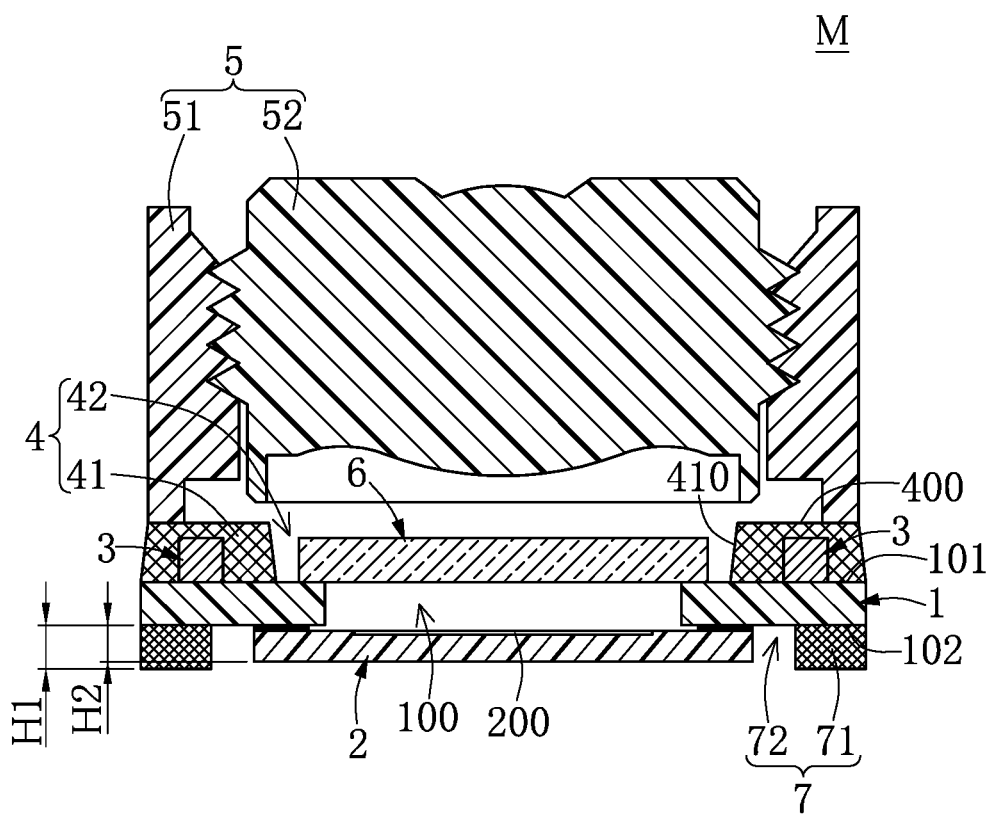
FIG. 4 shows a schematic view of the image-capturing module according to the third embodiment of the present disclosure.

Referring to FIG. 4, the third embodiment of the present disclosure provides an image-capturing module M, including a circuit substrate 1, an image-sensing chip 2, at least one electronic component 3, a package structure 4, and a lens assembly 5. Comparing FIG. 4 with FIG. 3, the difference between the third embodiment and the second embodiment is as follows: in the third embodiment, the filter element 6 is directly disposed on the circuit substrate 1 and spaced apart from the image-sensing chip 2.

Fourth Embodiment

Figure 5:
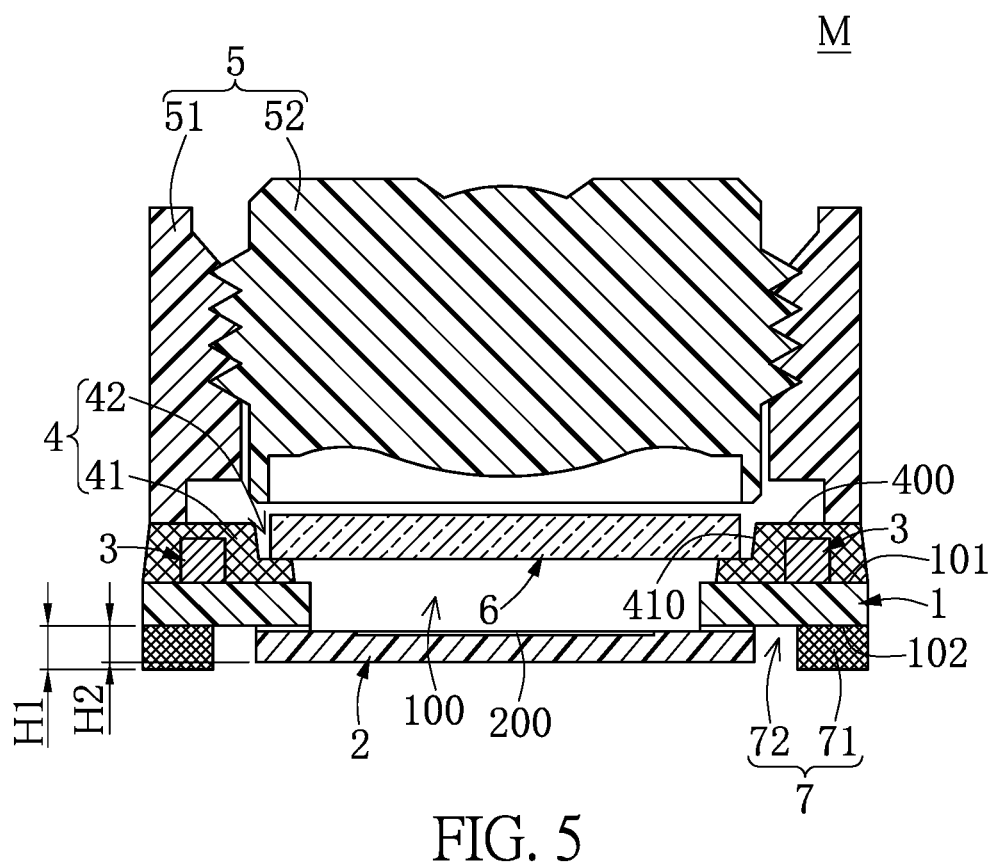
FIG. 5 shows a schematic view of the image-capturing module according to the fourth embodiment of the present disclosure.

Referring to FIG. 5, the fourth embodiment of the present disclosure provides an image-capturing module M, including a circuit substrate 1, an image-sensing chip 2, at least one electronic component 3, a package structure 4, and a lens assembly 5. Comparing FIG. 5 with FIG. 3, the difference between the fourth embodiment and the second embodiment is as follows: in the fourth embodiment, the filter element 6 is directly disposed on the package structure 4 and spaced apart from the circuit substrate 1. For example, a concave portion (not shown) can be formed on the package structure 4 in advance, and the filter element 6 can be disposed on the concave portion so as to decrease the distance between the filter element 6 and the circuit substrate 1.

That is to say, the filter element 6 can be disposed on the image-sensing chip 2 (shown as the first embodiment in FIG. 1), the circuit substrate 1 (shown as the third embodiment in FIG. 4), or the package structure 4 (shown as the fourth embodiment in FIG. 5) according to different requirements.

Figure 6:
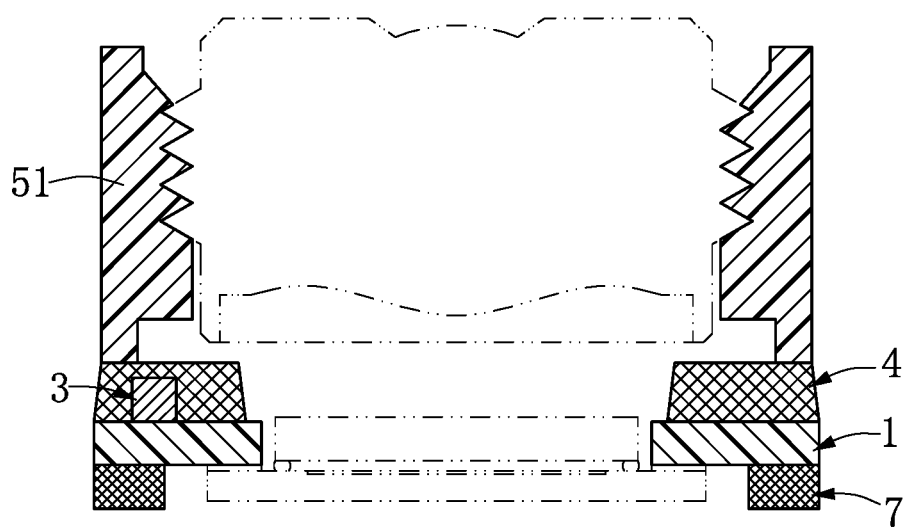
FIG. 6 shows a schematic view of a carrier assembly according to the present disclosure.

It should be noted that the present invention further provides a carrier assembly S, including a circuit substrate 1, a package structure 4, and a holder structure 51 as shown in FIG. 6. The circuit substrate 1 can be used for carrying at least one electronic component 3, and the at least one electronic component 3 is electrically connected to the circuit substrate 1. The package structure 4 is disposed on the circuit substrate 1 to cover or enclose the at least one electronic component 3, and the holder structure 51 is disposed on the package structure 4.

As described above, the carrier assembly S further includes a reinforcing structure 7 disposed on the circuit substrate 1, and the package structure 4 and the reinforcing structure 7 are disposed on two opposite surfaces of the circuit substrate 1.

That is to say, the carrier assembly S as shown in FIG. 6 can also be used for purposes other than carrying the image-sensing chip 2 and the lens structure 52 as shown in the first to the fourth embodiments.

Fifth Embodiment

Figure 7:
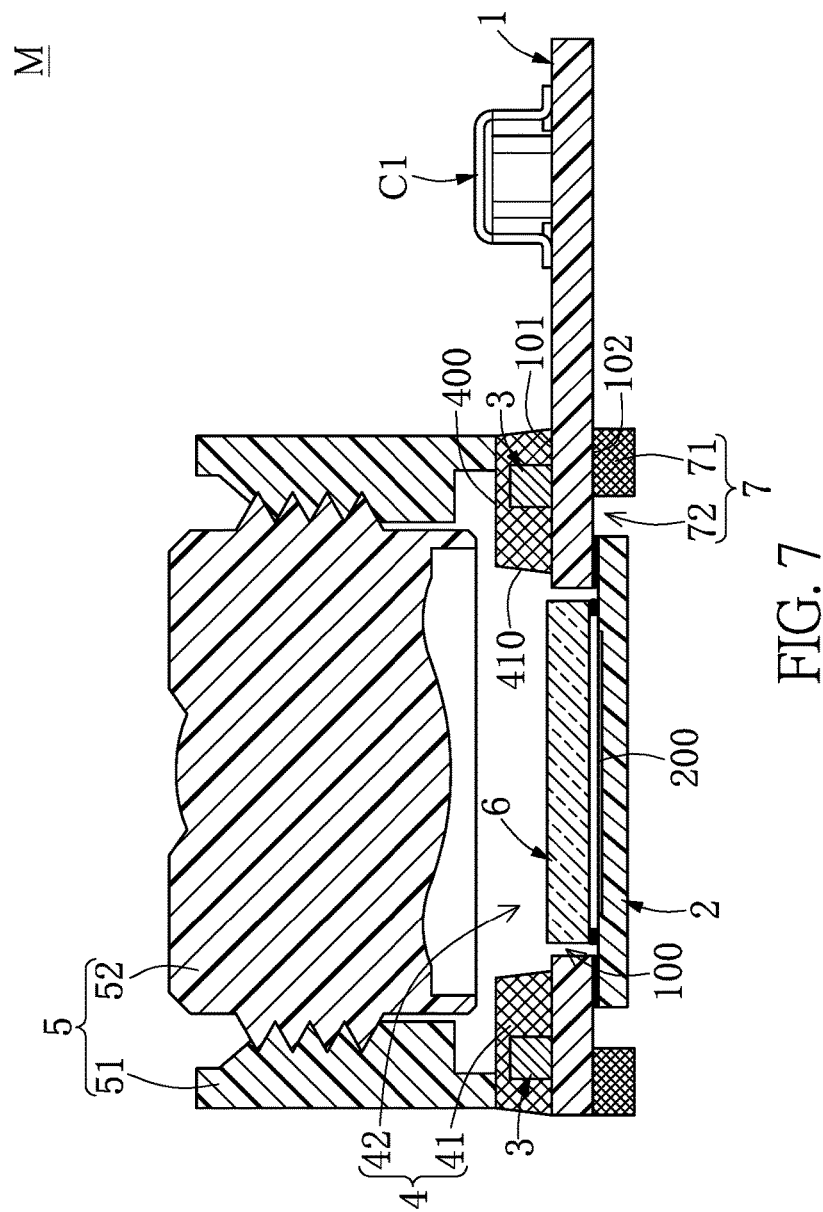
FIG. 7 shows a schematic view of the image-capturing module according to the fifth embodiment of the present disclosure.

Referring to FIG. 7, the fifth embodiment of the present disclosure provides an image-capturing module M, including a circuit substrate 1, an image-sensing chip 2, at least one electronic component 3, a package structure 4, and a lens assembly 5. Comparing FIG. 7 with FIG. 3, the difference between the fifth embodiment and the second embodiment is as follows: in the fifth embodiment, the circuit substrate 1 further includes an electrical connector C1, so that the image-capturing module M can be electrically connected to a terminal electronic module (not shown) through the electrical connector C1.

Sixth Embodiment

Figure 8:
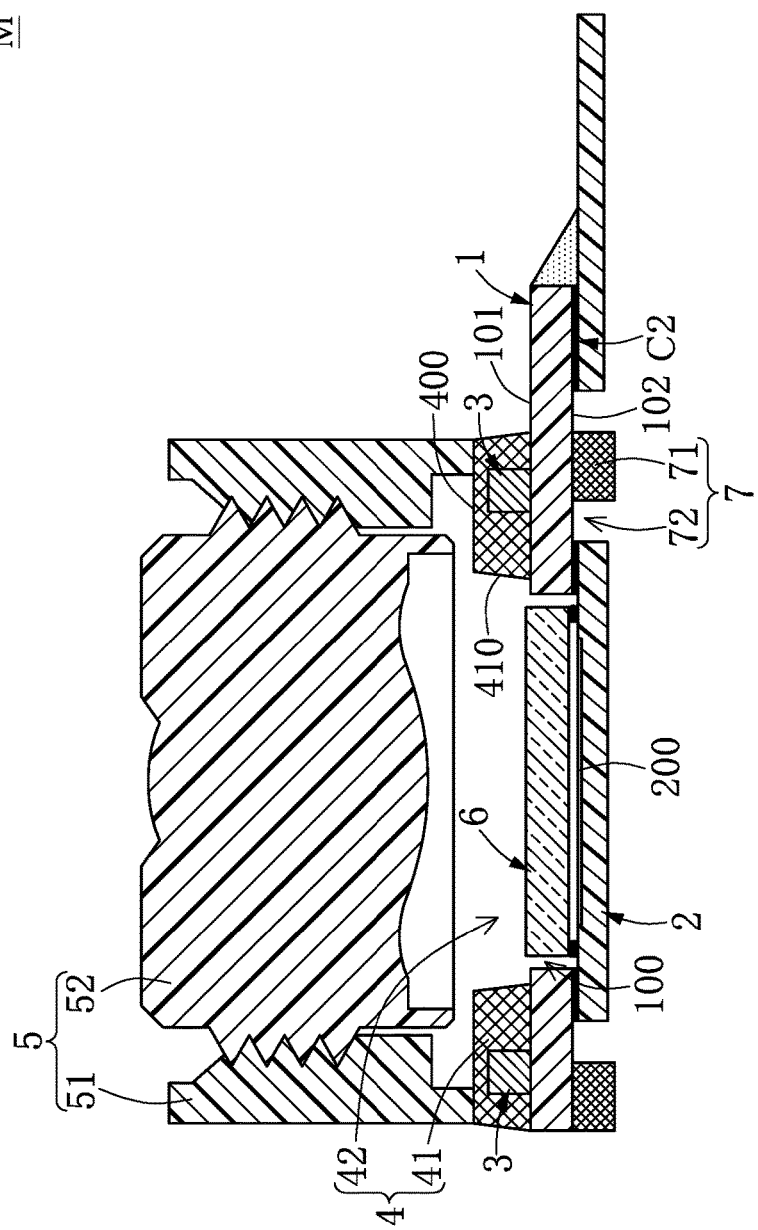
FIG. 8 shows a schematic view of the image-capturing module according to the sixth embodiment of the present disclosure.

Referring to FIG. 8, the sixth embodiment of the present disclosure provides an image-capturing module M, including a circuit substrate 1, an image-sensing chip 2, at least one electronic component 3, a package structure 4, and a lens assembly 5. Comparing FIG. 8 with FIG. 3, the difference between the sixth embodiment and the second embodiment is as follows: in the sixth embodiment, the image-capturing module M can be electrically bonded on a flexible PCB (not labeled) through a conductive structure C2 (such as a hot bar or an ACF), so that the image-capturing module M can be electrically connected to a terminal electronic module (not shown) through the flexible PCB. Therefore, the image-capturing module M can be electrically bonded on different flexible PCBs (not labeled) through the conductive structure C2 according to different requirements so as to increase the shareability of the image-capturing module M.

Seventh Embodiment

Figure 9:
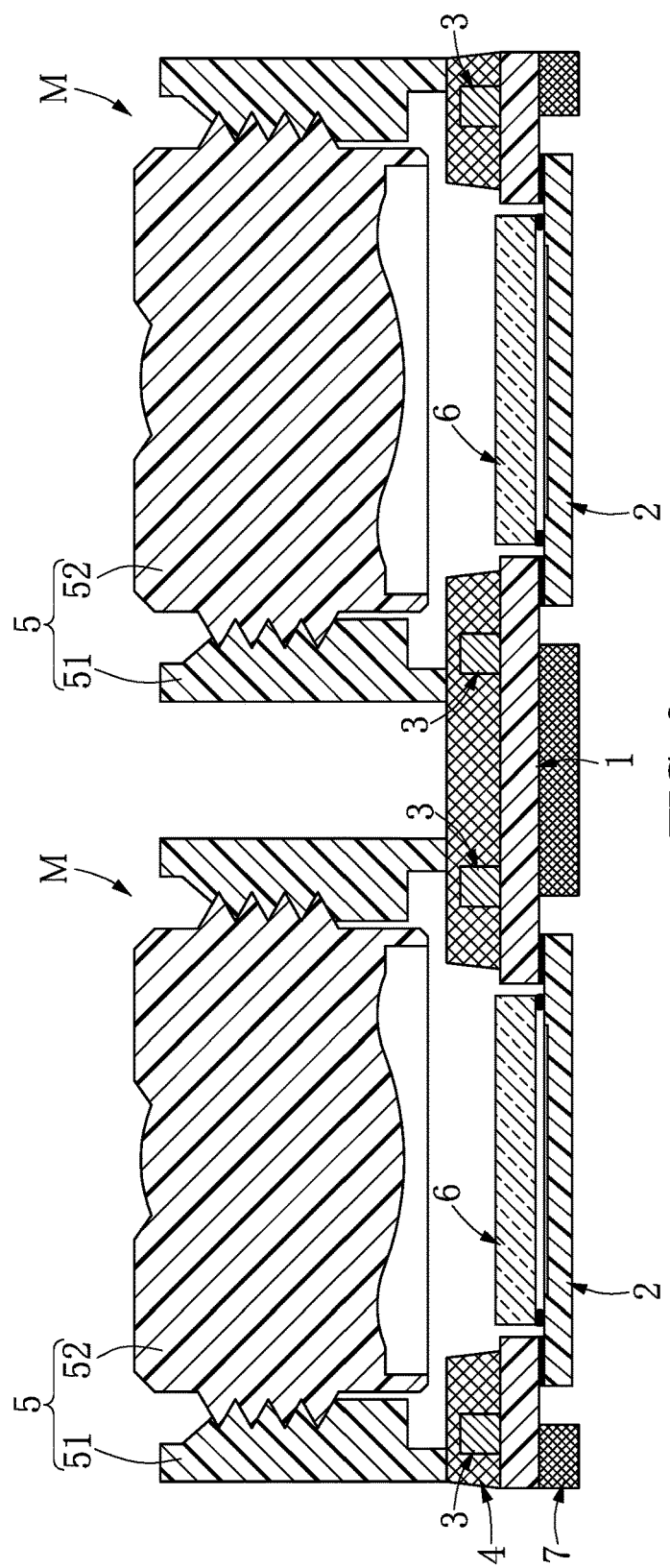
FIG. 9 shows a schematic view of the image-capturing module according to the seventh embodiment of the present disclosure.

Referring to FIG. 9, the seventh embodiment of the present disclosure provides two image-capturing modules M. Comparing FIG. 9 with FIG. 3, the difference between the seventh embodiment and the second embodiment is as follows: the seventh embodiment can use two image-capturing modules M (i.e., a dual camera) at the same time, and the two image-capturing modules M can share the same package structure 4 and the same reinforcing structure 7 according to different requirements.

Eighth Embodiment

Figure 10:
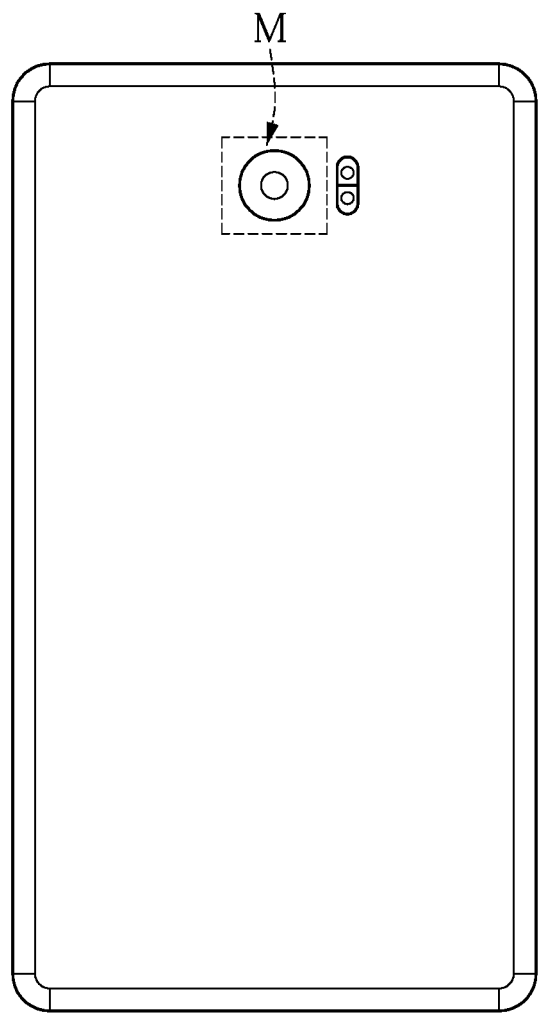
FIG. 10 shows a schematic view of a portable electronic device according to the eighth embodiment of the present disclosure.

Referring to FIG. 10, the eighth embodiment of the present disclosure provides a portable electronic device P using an image-capturing module M of any one of the first to the seventh embodiments. For example, the electronic device P may be a smart phone, a laptop, or a tablet computer, but it is not meant to limit the scope of the present disclosure. As shown in FIG. 10, the image-capturing module M can be used as a rear lens of the portable electronic device P, and the image-capturing module M includes a circuit substrate 1, an image-sensing chip 2, at least one electronic component 3, a package structure 4, and a lens assembly 5, but it is not meant to limit the scope of the present disclosure.

Therefore, the horizontal width or the horizontal size of the holder structure 51 can be decreased by matching the features of "the package structure 4 being disposed on the circuit substrate 1 to cover the at least one electronic component 3" and "the holder structure 51 being disposed on the package structure 4". That is to say, the holder structure 51 can be directly disposed on the package structure 4 without horizontally moving away from the electronic component 3, so that the horizontal width (such as X direction width or Y direction width) of the holder structure 51 can be decreased, or the horizontal size (i.e., the size in a horizontal direction) of the holder structure 51 can be decreased.

Moreover, the flattening surface 400 of the package structure 4 can be used as a carrier substrate for carrying the lens assembly 5, so that the flatness of the lens assembly 5 relative to the circuit substrate 1 can be increased, and the alignment precision between the lens assembly 5 and the image-sensing chip 2, that is to say, the tilt of the lens assembly 5 relative to the image-sensing chip 2 is decreased.

It should be noted that the package structure 4 is disposed on the top surface 101 of the circuit substrate 1 so as to increase the structural strength of the circuit substrate 1 due to the support of the package structure 4, so that the rigidity of the circuit substrate 1 can be increased without causing warpage. In addition, the reinforcing structure 7 is disposed on the bottom surface 102 of the circuit substrate 1 so as to increase the structural strength of the circuit substrate 1 due to the support of the reinforcing structure 7, so that the rigidity of the circuit substrate 1 can be increased without causing warpage.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:
1. An image-capturing module, comprising:
a circuit substrate having a top surface and a bottom surface;
an image-sensing chip electrically connected to the circuit substrate, wherein the image-sensing chip has an image-sensing area;
at least one electronic component disposed on the top surface of the circuit substrate and electrically connected to the circuit substrate;
a package structure disposed on the top surface of the circuit substrate and in contact with the at least one electronic component;
a lens assembly including a holder structure disposed on the package structure and a lens structure held by the holder structure and corresponding to the image-sensing area; and
a reinforcing structure disposed on the bottom surface of the circuit substrate to surround the image-sensing chip, a thickness of the reinforcing structure being greater than a thickness of the image-sensing chip, wherein the reinforcing structure includes a reinforcing board surrounding the image-sensing chip and a receiving space passing through the reinforcing structure, and the whole image-sensing chip is received inside the receiving space of the reinforcing structure.

2. The image-capturing module of claim 1, further comprising a filter element disposed on one of the circuit substrate, the image-sensing chip and the package structure, and the filter element being disposed between the image-sensing chip and the lens structure, wherein the circuit substrate has a through opening connected between the top surface and the bottom surface of the circuit substrate, the image-sensing chip is disposed on the bottom surface of the circuit substrate, and the image-sensing area of the image-sensing chip faces the through opening of the circuit substrate.

3. The image-capturing module of claim 2, wherein the package structure has a flattening surface, and the holder structure is disposed on the flattening surface of the package structure without contacting the circuit substrate, and wherein the package structure has a single package body and a light-transmitting window passing through the single package body and being communicated with the through opening, and the single package body has a surrounding light-guiding surface disposed inside the light-transmitting window.

4. The image-capturing module of claim 2, wherein the package structure has a dustproof coating disposed on an outer surface thereof, and the holder structure is disposed on the dustproof coating of the package structure without contacting the circuit substrate, and wherein the package structure has a single package body and a light-transmitting window passing through the single package body and being communicated with the through opening, and the single package body has a surrounding light-guiding surface disposed inside the light-transmitting window.

5. A carrier assembly, comprising:
   a circuit substrate for carrying at least one electronic component, wherein the at least one electronic component is electrically connected to the circuit substrate;
   a package structure disposed on the circuit substrate and in contact with the at least one electronic component;
   a holder structure disposed on the package structure; and
   a reinforcing structure disposed on the circuit substrate, the package structure and the reinforcing structure being disposed on two opposite surfaces of the circuit substrate, wherein the package structure has a dustproof coating disposed on an outer surface thereof, and the holder structure is disposed on the dustproof coating of the package structure without contacting the circuit substrate, and wherein the package structure has a single package body and a light-transmitting window passing through the single package body, and the single package body has a surrounding light-guiding surface disposed inside the light-transmitting window.

6. A portable electronic device using an image-capturing module, characterized in that the image-capturing module comprises:
   a circuit substrate having a top surface and a bottom surface;
   an image-sensing chip electrically connected to the circuit substrate, wherein the image-sensing chip has an image-sensing area;
   at least one electronic component disposed on the top surface of the circuit substrate and electrically connected to the circuit substrate;
   a package structure disposed on the top surface of the circuit substrate and in contact with the at least one electronic component;
   a lens assembly including a holder structure disposed on the package structure and a lens structure being held by the holder structure and corresponding to the image-sensing area; and
   a reinforcing structure disposed on the bottom surface of the circuit substrate to surround the image-sensing chip, and a thickness of the reinforcing structure is greater than a thickness of the image-sensing chip, wherein the reinforcing structure includes a reinforcing board surrounding the image-sensing chip and a receiving space passing through the reinforcing structure, and the whole image-sensing chip is received inside the receiving space of the reinforcing structure.

7. The portable electronic device of claim 6, wherein the image-capturing module further comprises a filter element disposed on one of the circuit substrate, the image-sensing chip and the package structure, and the filter element is disposed between the image-sensing chip and the lens structure, and wherein the circuit substrate has a through opening connected between the top surface and the bottom surface of the circuit substrate, the image-sensing chip is disposed on the bottom surface of the circuit substrate, and the image-sensing area of the image-sensing chip faces the through opening of the circuit substrate.

* * * * *